(12) United States Patent
Cheng et al.

(10) Patent No.: US 10,409,048 B2
(45) Date of Patent: Sep. 10, 2019

(54) METHOD AND APPARATUS FOR ULTRAFAST TIME-RESOLVED DIGITAL HOLOGRAPHY

(71) Applicant: National Taiwan Normal University, Taipei (TW)

(72) Inventors: Chau-Jern Cheng, Taipei (TW); Yu-Chih Lin, Taipei (TW)

(73) Assignee: NATIONAL TAIWAN NORMAL UNIVERSITY, Taipei (TW)

( * ) Notice: Subject to any disclaimer, the term of this patent is extended or adjusted under 35 U.S.C. 154(b) by 121 days.

(21) Appl. No.: 15/670,683

(22) Filed: Aug. 7, 2017

(65) Prior Publication Data

US 2018/0329191 A1 Nov. 15, 2018

(30) Foreign Application Priority Data

May 11, 2017 (TW) .............................. 106115633 A

(51) Int. Cl.
G02B 21/06 (2006.01)
G01R 31/311 (2006.01)
G02F 1/39 (2006.01)

(52) U.S. Cl.
CPC ............ *G02B 21/06* (2013.01); *G01R 31/311* (2013.01); *G02F 1/39* (2013.01)

(58) Field of Classification Search
None
See application file for complete search history.

(56) References Cited

U.S. PATENT DOCUMENTS

| 7,224,828 | B2 | 5/2007 | Cotton et al. |
| 2004/0190134 | A1 | 9/2004 | Tahara et al. |
| 2010/0149139 | A1* | 6/2010 | Kroll .................. G02B 26/0875 345/204 |
| 2010/0157399 | A1* | 6/2010 | Kroll ....................... G03H 1/02 359/11 |
| 2012/0044320 | A1* | 2/2012 | Spivey ................ G03H 1/0443 348/40 |

FOREIGN PATENT DOCUMENTS

| CN | 101763019 B | 11/2011 |
| CN | 102841498 A | 12/2012 |
| CN | 204129432 U | 1/2015 |

OTHER PUBLICATIONS

Yu-Chih Lin, Chau-Jern Cheng and Li-Chien Lin, "Tunable time-resolved tick-tock pulsed digital holographic microscopy for ultra-fast events", Optics Letters, revised Apr. 15, 2017; accepted Apr. 25, 2017; posted May 5, 2017 (Doc. ID 290376).

* cited by examiner

*Primary Examiner* — Jennifer D. Carruth
(74) *Attorney, Agent, or Firm* — Muncy, Geissler, Olds & Lowe, P.C.

(57) ABSTRACT

A method for ultrafast time-resolved digital holography comprises (a) providing tunable timescale at least two tick-tock pulses arriving on a sample to be measured at various timescales, (b) spatial encoding for wavefronts of the sample by utilizing at least one optical encoder, (c) utilizing a digital holographic access unit to record a composite hologram of the spatial encoded wavefronts by the same single pulse source, (d) utilizing an encoder for obtaining at least two holograms, and (e) utilizing a compressive sensing approach or a non-linear image restoration approach and a wavefront reconstruction approach to obtain the reconstructed wavefronts information of the sample.

20 Claims, 14 Drawing Sheets

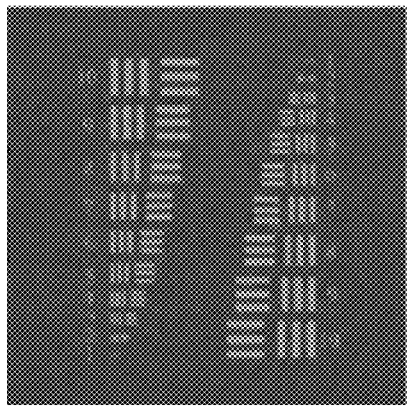
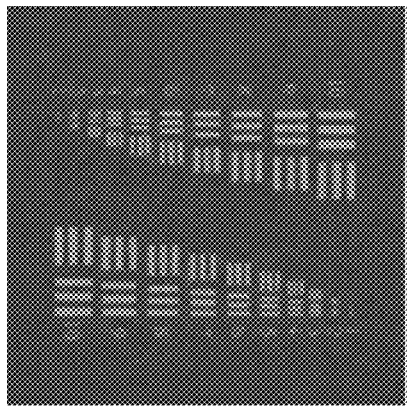
FIG. 7

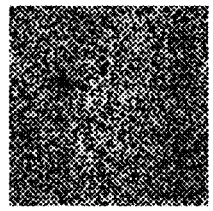
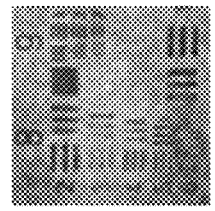
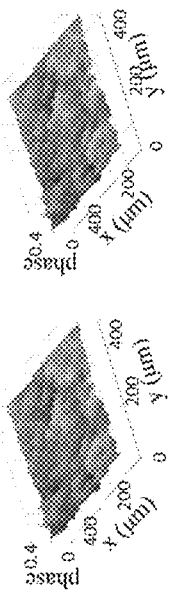
FIG.9a
FIG.9b
FIG.9c

METHOD AND APPARATUS FOR ULTRAFAST TIME-RESOLVED DIGITAL HOLOGRAPHY

TECHNICAL FIELD

The present invention relates to an optical detection technique, and more particularly by utilizing a spatial light modulator for spatial multiplexing encoding, and digital holographic wavefront recording to record a single digital hologram in a single wavefront recording process, and thereby achieving tunable time-resolved digital holographic microscopy for ultrafast events detection.

BACKGROUND

With the rapid development and progress of laser photoelectric technology, biomedical imaging technology combined with photoelectric technology will become a promising new industry in the future. For example, some new breakthrough has been made by research on biomedical cells imaging or by laser beams as a therapeutic tool. In the past ten years, the performance of pulse width, pulse energy and pulse wavelength tunable range of pulsed laser are greatly improved, and therefore the overall stability and easy operation in the ultra-short pulse laser system are highly improved. Prospective applications such as laser surgery (Photodisruption), photodynamic therapy and optogenetics, have also been developed in the biomedical field. In order to provide more complete and accurate biomedical image information, three-dimensional detection technology has become a trial and trend of current development.

At present, a noninvasive, non-destructive optical imaging technology in biomedical imaging observation or industrial inspection related fields includes digital holographic microscope photography, confocal laser microscopy, nonlinear optical microscopy.

Ultrafast camera, such as streak camera, has the fastest imaging speed, a single frame up to several picoseconds, and time interval between the images is up to hundreds of picoseconds. This technique can't reach the femtosecond time scale, and can only obtain light intensity information with low spatial resolution. It can't achieve full field wavefront detection mechanism. In pulsed laser microscopy, pulsed beam has ultra-short time window characteristics, so it can be used for ultrafast detection. However, only the light intensity detection can't achieve the full field wavefront detection.

In addition, in the ultrafast pulsed digital holography, combining the pulse ultra-short time window characteristics with digital holographic recording scheme, it mostly only provides a single pulse laser recording, and the time interval is limited by image sensor. The partially multiplexing mechanism needs to be adjusted by complicate angle and interference coherence matching, so that it is difficult to adjust the time, and difficult to apply.

Currently, most of the ultrafast optical detection technologies proposed in the world are mainly based on the detection of light intensity images, which may refer to the United States patent application number US, 2004/0190134, A1 and the U.S. Pat. No. 7,224,828 B2. Although this method can detect ultra-short time window characteristics of pulse beam source, it can't detect and analyze the full beam wave information. In addition, there is a drawback in this method that it is impossible to detect several pulses information at the same time, so that time interval of detection is limited by the image sensor, and it can't achieve the goal of ultrafast time analysis.

In the field of ultrafast digital holography, Prof. Hayasaki, et al. propose the use of ultrashort pulsed light source in digital holographic photography to achieve ultrafast full field wavefront detection. It used to observe the response as pulse laser applied to materials, achieving the mechanism of femtosecond window observation and detecting the linear and nonlinear optical phenomena. However, the same single pulse detection problem makes its time interval never to fulfill the mechanism of ultrafast time resolution. In this case, Prof. Zhai disclosed in the 2006 International Journal Optics Letters that the spatial multiplexing mechanism enables multiple pulse recording and detection in single detection. However, the complex spatial angle multiplexing system leads to difficultly adjust in time analysis of different time dimension such that such technology is limited to laboratory and not easy to promote.

In addition, in Chinese patent application number CN 204129432 U, CN 102841498, CN101763019B, the scheme of these patents can't be used for full field wavefront detection.

Thus, there are many shortcomings in conventional method of measurement. It is necessary to develop a novel digital image analysis technique to solve and overcome the above problems.

SUMMARY OF THE INVENTION

The invention provides a newly spatial-multiplexing encoding scheme for ultrafast digital holographic detection technology, through the spatial light modulator for binary encoding at least two beam pulses. The beam pulses can be separated in space, and it can achieve the detection of simultaneously multiplexing and recording optical field of at least two beam pulses in a single holographic exposure. The method and the scheme of the invention can adjust the optical path of the beam pulses simply without complex angle adjusting and interference coherence matching, and thereby achieving the purpose of tunable time-resolved. The time interval of detection can also be adjusted to the range of nanoseconds to femtosecond, and then the purpose of ultrafast time-resolved of full field wavefront detection is achieved.

The present invention utilizes a spatial light modulator for spatially encoding wavefront of multiple beam pulses, and utilizes a digital holographic recording scheme for recording wavefront of the encoded beam pulses. The ultrafast digital holographic device is used to obtain several time-resolved images in a single recording process, which can go beyond the industrial use of image sensor, and accurately reach wavefront imaging from nanosecond to femtosecond time interval. The sampling speed of the invention can break through the sampling limit of the traditional image sensor.

A method for ultrafast time-resolved digital holography comprises the following steps: (a) providing at least two beam pulses with adjustable elapsed time which arrive on a sample under measuring at different time points to stimulate or observe the dynamic changes of optical field of the wavefront of the sample; (b) spatially encoding for a wavefront of the at least two beam pulses by at least one optical encoder; (c) recording a one-shot composite digital hologram of the encoded spatial wavefront by at least one digital holographic access unit in a single exposing process; (d) decoding the composite digital hologram to obtain at least two different digital holograms by at least one decoder; (e)

utilizing an image processing approach for processing the at least two different digital holograms to recover hologram data of the sample; and (f) utilizing a wavefront reconstructing approach to reconstruct the hologram data to obtain a reconstructed wavefront of the sample.

The optical encoder includes a spatial light modulator or a micro display. The digital holographic access unit includes a photodetector array or an image sensor. The wavefront reconstructing approach includes Fourier transform approach, convolution approach, angular spectrum approach or Fresnel diffraction approximation approach. The image processing approach includes a compressive sensing approach or a non-linear image recovery approach.

An apparatus for time-resolved digital holography comprises: a pulsed laser for creating at least two beam pulses which arrive on a sample under measuring at different time points; an optical encoder for spatially encoding a wavefront of the at least two beam pulses; a digital holographic access unit for recording the encoded spatial wavefront of the at least two beam pulses; and a wavefront reconstruction unit to reconstruct the wavefront of the at least two beam pulses.

The apparatus further comprises a beam splitting element configured in front of the pulsed laser. The wavefront reconstruction unit includes at least one computer, used for decoding, separating wavefront of said at least two beam pulses.

BRIEF DESCRIPTION OF THE DRAWINGS

The components, characteristics and advantages of the present invention may be understood by the detailed descriptions of the preferred embodiments outlined in the specification and the drawings attached:

FIG. 7 illustrates a schematic pattern of reconstructed tick-tock digital hologram after performing compression sensing approach according to an embodiment of the invention;

FIG. 9a illustrates digital tick-tock hologram recorded by the wavefront of the two beam pulses after binary coding;

FIG. 9b illustrates reconstructed amplitude image information of digital tick-tock hologram;

FIG. 9c illustrates reconstructed phase image information of digital tick-tock hologram;

DETAILED DESCRIPTION

Figure 1:
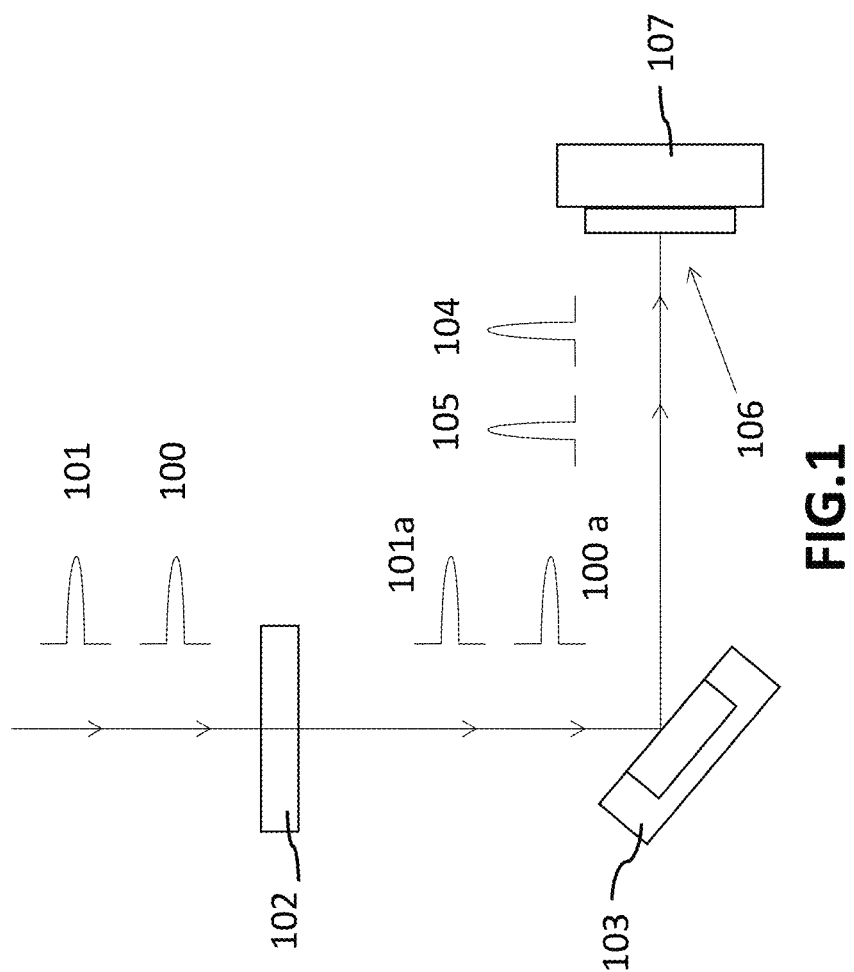
FIG. 1 illustrates a schematic comprehension of tunable time-resolved digital hologram according to the present invention.

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

The invention utilizes a spatial light modulator for spatial multiplexing encoding of multiple pulsed beam (light) which pass through a sample in different time, and digital holographic wavefront recording to record a single digital hologram in a single wavefront recording process, so as to achieve the purpose of ultrafast full-field wavefront detection of tunable time-resolved.

An apparatus for ultrafast time-resolved digital holography of the present invention comprises: (a) a pulse laser system for generating at least two pulsed beam wavefront reaching to a sample in different time; (b) an optical encoder, including at least one spatial light modulator for optical field encoding at least two pulsed beam wavefront for their light field separating in the space; (c) a digital holographic access unit, including at least one digital holographic wavefront access unit to record the encoded at least two pulsed beam wavefront; (d) a wavefront reconstruction unit, including at least one computer, used for decoding, separating wavefront of at least two pulsed beam and reconstructing thereof.

Optical path difference of the at least two pulsed beam wavefront is adjusted for reaching to the sample at different time such that a sample is to be stimulated or the change of full-field of the sample is observed in tunable time-resolved. The optical field of the at least two pulsed beam wavefront is encoded by at least one spatial light modulator, so that the optical field is separated in space to achieve the purpose of spatial multiplexing. The wavefront propagation information of the spatially separated at least two pulsed beam wavefront is recorded in a single recording process by at least one digital holographic wavefront access unit, and followed by reconstructing the optical field. In the digital holographic reconstruction process, the wavefront information of the at least two pulsed beams may be obtained and reconstructed from the holograms by an optical field decoding and an image processing algorithm. The reconstructed wavefront information will represent the information of time tunable ultrafast wavefront imaging. In one example, the physical mechanism, such as pulse-induced thermal effect and the optical stimulation effect, can be observed based-on the proposed apparatus and method, and the tunable time-resolved can be represent in nanoseconds and femtoseconds time axis, respectively. Thus, the proposed method is applied to explore the ultrafast physical phenomenon by quantitative phase imaging with a stopwatch-like tunable timescale is ranging from nanoseconds to femtoseconds.

The invention provides a method and an apparatus for ultrafast time-resolved digital holography, which includes:

(1) the mechanism of pulsed wavefront pumping or probing sample: controlling at least two pulses to the sample in order to detect the sample. By changing optical path of the optical pulsed wavefront, an optical path difference is created in the two pulses wavefront for different detection time.

(2) spatially coding of the pulsed wavefront: two pulsed wavefront is manipulated for binary coding by the spatial light modulator. The spatial distribution of the two pulsed wavefront is spatially separated by complementary binary coding. The spatial multiplexing scheme can avoid complex modulation of angle and coherent, so that optical path of the two pulsed wavefront can be adjusted to achieve the function of tunable time-resolved.

(3) digital holographic recording and reconstructing scheme: through the digital holographic recording scheme, it can record two encoded pulsed wavefront in a single recording and exposure. Through the processes of decoding and image processing by binary coding, the sample information of at least two pulsed wavefront can be reconstructed correctly. In the scheme and method of the wholly recording and reconstructing, tunable and ultrafast time-resolved imaging of whole field wavefront within several time intervals can be achieved.

As shown in FIG. 1, it illustrates a schematic comprehension of tunable time-resolved digital hologram according to the present invention. The present invention is applicable to the processing of at least one hologram image of a standard sample, for example including cells, microorganisms, bacteria, micro-size object, etc. The holographic images can be generated by optical systems of some embodiments. First, two beam pulses 100 and 101 are successively incident to a sample 102, and then object wave 100a and 101a are generated respectively to facilitate detecting the sample, as shown in FIG. 1. There is an elapsed time between the beam pulse 100 and the beam pulse 101. The elapsed time or time resolution can be pulse width. The two beam pulses 100 and 101 can be generated by an identical laser source module during an elapsed time. Then, the two object waves 100a and 101a of the sample 102 are encoded by an optical encoder 103 (e.g., spatial light modulator), such as forming a binary code. For example, the part of encoded 0 (zero) indicates no beam passing, while the part of encoded 1 (one) indicates beam passing; or, the part of encoded 0 (zero) indicates beam passing, while the part of encoded 1 (one) indicates no beam passing. By utilizing complementary binary coding, the spatial wavefront distribution of the two object waves 100a and 101a are spatially separated by complementary binary coding. In one embodiment, the spatial light modulator 103 includes an amplitude modulator and a phase modulator. The signal beams 104 and 105 are interfered with the reference light 106, and the interfered beam is recorded on an image sensor 107. For example, the interfered beam is recorded on the image sensor 107 via a phase modulation mask.

Figure 2:
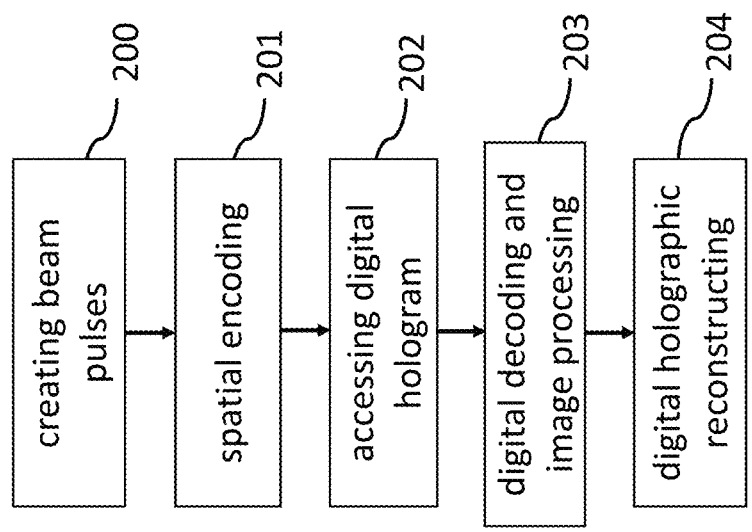
FIG. 2 illustrates a flow chart of forming tunable time-resolved digital hologram according to one embodiment of the present invention.
Figure 3:
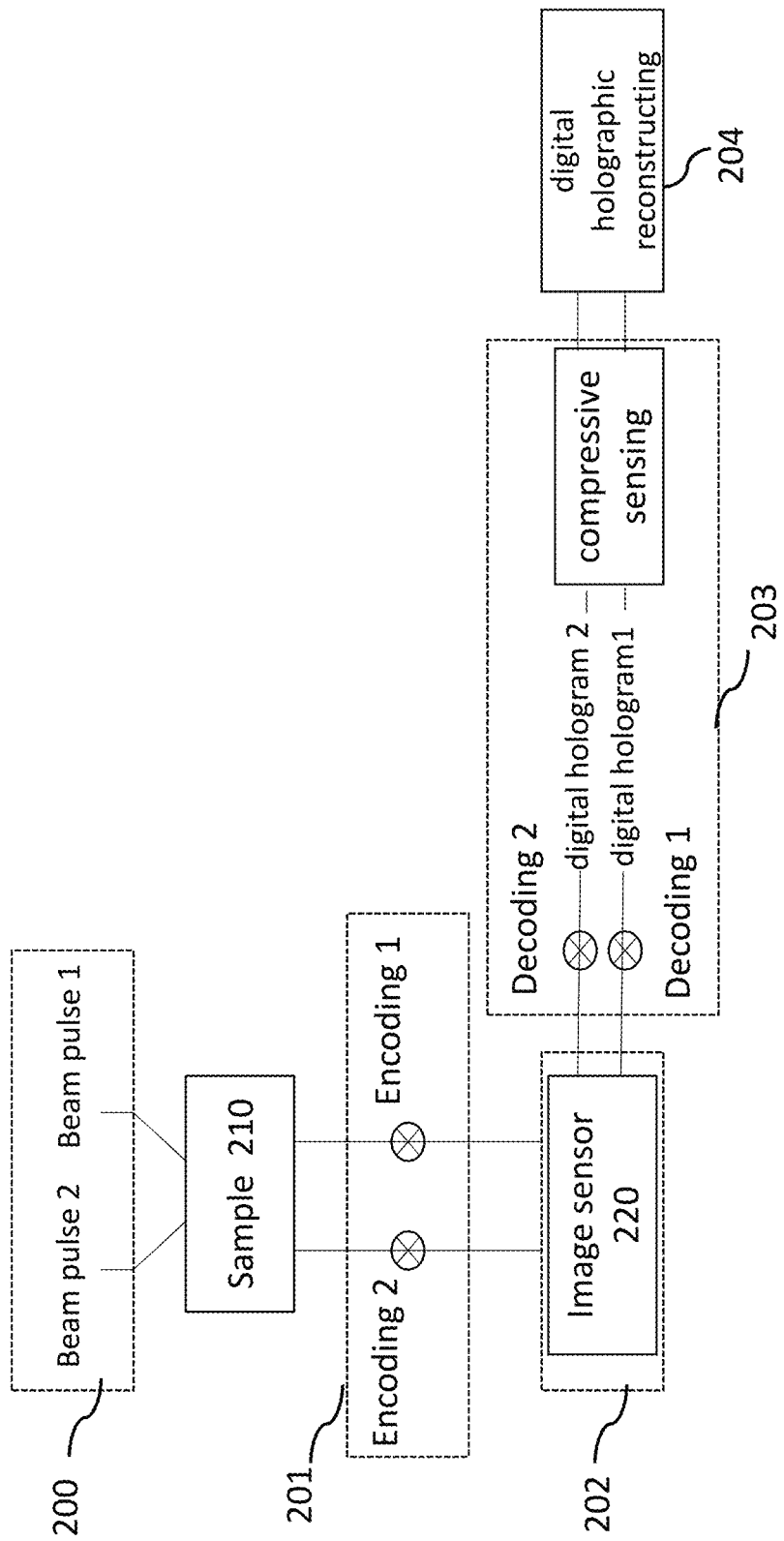
FIG. 3 illustrates a flow chart of forming tunable time-resolved digital hologram according to one embodiment of the present invention.
Figure 4:
FIG. 4a illustrates simulation patterns of the object wave 1 and the object wave 2.
FIG. 4b illustrates simulation patterns of the object wave encoding 1 and the object wave encoding 2.

As shown in FIG. 2, it shows a flow chart of forming tunable time-resolved digital hologram according to one embodiment of the present invention. The digital hologram of the present invention may be generated by optical systems of some embodiments. The method of forming digital hologram includes a step 200 creating beam pulses. As shown in FIG. 3, two beam pulses (tick-tock pulses), beam pulse 1 and beam pulse 2, are successively incident to a sample 210, and then an object wave 1 and an object wave 2 are generated one after another. The beam pulse 1 is created by an elapsed time previous to the beam pulse 2. The simulation patterns of the object wave 1 and the object wave 2 are indicated by 211 and 212 respectively, as shown in FIG. 4a. Then, in a step 201, spatial encoding of the object wave 1 and the object wave 2 is performed. For example, spatial wavefront of the object wave 1 and the object wave 2 of the sample 210 are encoded by an optical encoder to form encoding 1 and encoding 2 respectively; the encoding 1 represents recoding for the object wave 1 of the beam pulse 1, and the encoding 2 represents recoding for the object wave 2 of the beam pulse 2. The simulation patterns of the encoding 1 and the encoding 2 are indicated by 213 and 214 respectively, as shown in FIG. 4b. The optical encoder includes at least one spatial light modulator (SLM) or micro display. The spatial wavefront distribution of the two object waves are spatially separated by complementary binary coding. Next, a step 202 is executed to access digital hologram of the two object waves of the two beam pulses.

Figure 5:
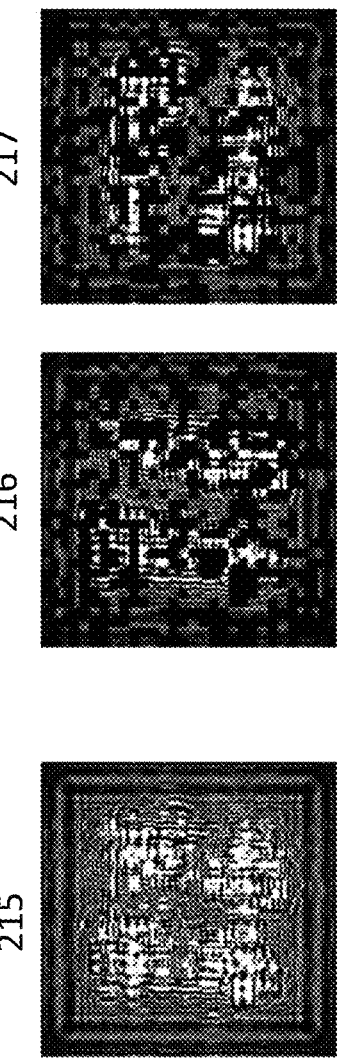
FIG. 5a illustrates a schematic pattern of the composite digital hologram according to an embodiment of the invention.
FIG. 5b illustrates a schematic pattern of tick-tock digital hologram according to an embodiment of the invention.
Figure 6:
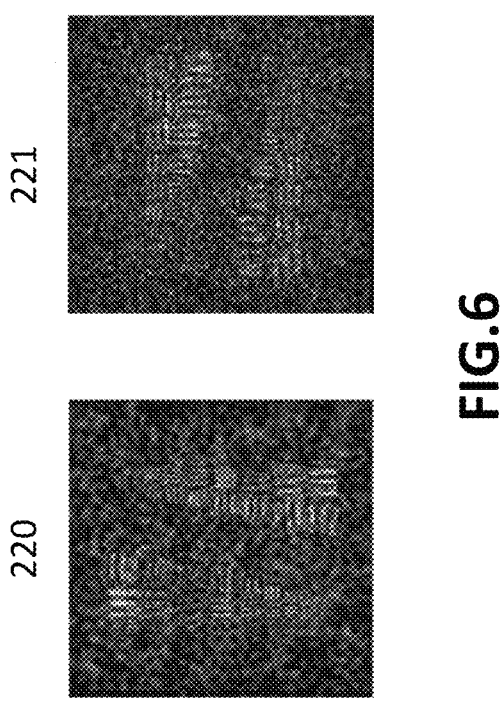
FIG. 6 illustrates a schematic pattern of reconstructed tick-tock digital hologram without compression sensing approach according to an embodiment of the invention.

In the step 202, a one-shot composite digital hologram of the encoded spatial wavefront of the two object waves of the sample is recorded by a digital holographic access unit in a single exposing process (acquisition process). In this step, the incident light is interfered with the reference light, and at least one image sensor is used to record the interference information. The digital holographic access unit comprises at least one photodetector array (e.g. image sensor) used to record wavefront information, and a computing device used to digitally access the wavefront information, to produce the composite digital hologram 215, as shown in FIG. 5a. In one embodiment, as the two object waves are passing through the spatial light modulator, one part of the two object beams is modulated by the phase modulator to be as a reference beam, and the other part of the two object beams is modulated by the amplitude modulator to be as signal beam respectively. The signal beam and the reference beam are interfered with each other, and the interference beam of them is recorded on an image sensor 230. Subsequently, in a step 203, digital decoding and image processing are performed. For example, at least one decoder is used for decoding the composite digital hologram 215 to obtain a digital hologram at two different time points, including a digital hologram 1 of a decoding 1 and a digital hologram 2 of a decoding 2. The digital hologram 1 corresponds to the decoding 1, and the digital hologram 2 corresponds to the decoding 2, as shown in FIG. 3. The simulation patterns of the digital hologram 1 and the digital hologram 2 are indicated by 216 and 217 respectively, as shown in FIG. 5b. An image processing algorithm, such as compressive sensing, is used to process digital hologram at different time points. In the absence of the compressive sensing approach (algorithm), the simulation patterns of the digital hologram 1 and the digital hologram 2 are indicated by 220 and 221 respectively, as shown in FIG. 6. In another embodiment, the image processing algorithm includes nonlinear image recovery approach.

In contrast, after performing a compression sensing approach, in the step 204, it performs a digital holographic reconstruction approach to obtain wavefront reconstruction of the sample at different time points. After the compressive sensing approach and the digital holographic reconstruction approach are performed, the reconstructed simulation patterns of the digital hologram 1 and the digital hologram 2 are indicated by 222 and 223 respectively, as shown in FIG. 7. As known in FIG. 7, as implementing the compression sensing approach and the digital holographic reconstruction approach, two complete digital hologram data are recovered. The digital holographic reconstruction approach includes but not limited to numerical propagation approach (algorithm) of Fourier transform approach (algorithm), convolution approach (algorithm), angular spectrum approach (algorithm) or Fresnel diffraction approximation approach (algorithm) to reconstruct wavefront of penetrating beam through the sample. In the reconstruction method of Fourier transform approach (algorithm), the number of pixels changes with the reconstruction distance. Such feature causes size reduction of the reconstructed image pixel to avoid the restriction of pixel size of the actual photodetector array and achieve high-fidelity image reconstruction simultaneously.

Figure 8:
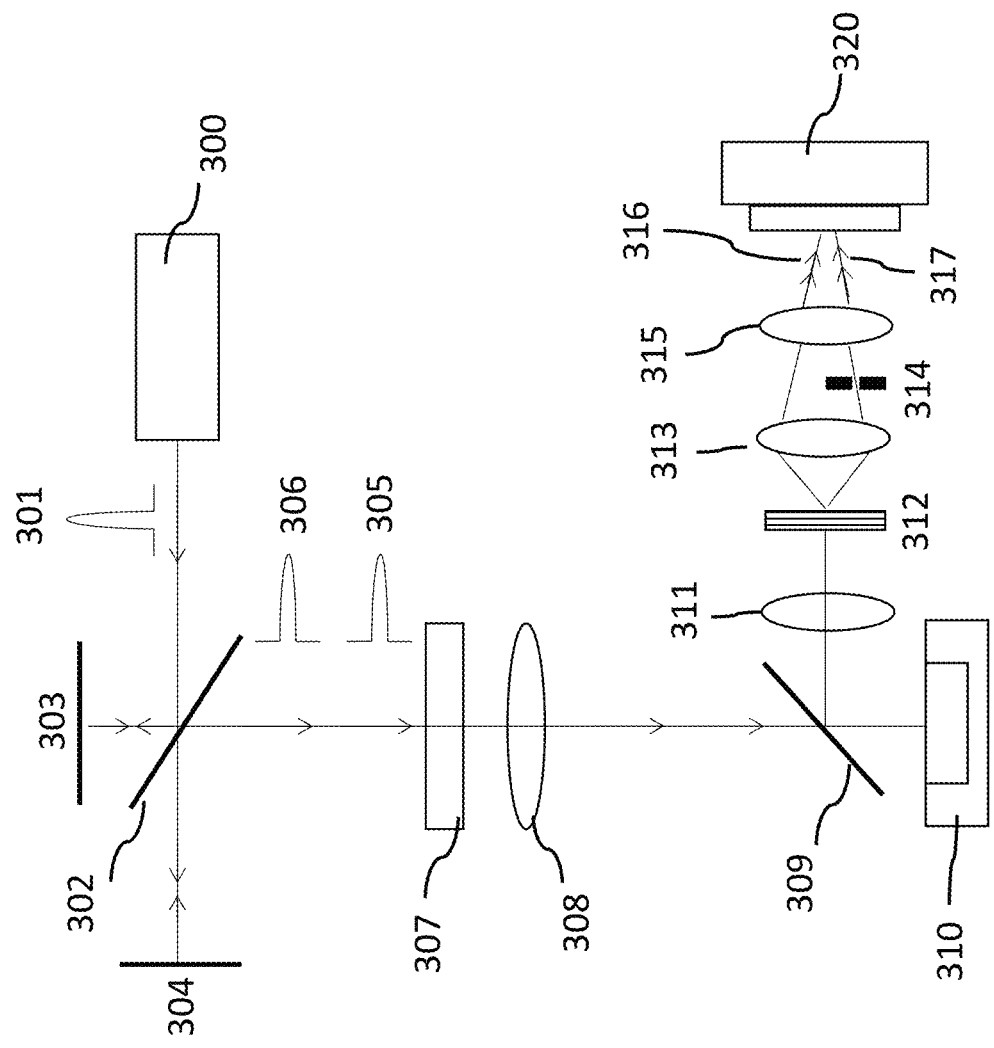
FIG. 8 illustrates a schematic diagram of tunable time-resolved tick-tock pulse digital holographic microscopy (TTP-DHM) according to one embodiment of the present invention.

As shown in FIG. 8, it illustrates a schematic diagram of tunable time-resolved tick-tock pulse digital holographic microscopy (TTP-DHM) according to one embodiment of the present invention. The present embodiment utilizes beam pulses incident into a sample to produce a digital hologram. An optical system creates a detection beam and a reference beam. For example, the optical system includes a light source, at least one beam splitter, an optical encoder, at least one photodetector array (for example: Charge-coupled device (CCD), Complementary Metal-Oxide-Semiconductor (CMOS) image sensor, photodetector), at least one grating, at least one filter, multiple lenses and multiple mirrors. The light source includes a vertical-cavity surface-emitting laser (VCSEL), a semiconductor laser, a solid-state laser, a gas laser, a dye laser, a fiber laser or light emitting diodes (LED). The emission type of the light source comprises a line light source, a planar light source or a spherical light source. The light source includes coherent light source, low coherent light source or incoherent light source. A pulsed laser can be produced by a pulsed laser system. For example, the pulsed laser system includes a laser pump, at least one fiber grating, at least one core gain fiber, an auxiliary laser and a multiplexing wavelength splitter, and laser beam of the pulsed laser is output from the fiber grating. In this embodiment, optical path of the optical system includes: a laser source 300, such as a Ti-sapphire laser, emits a beam pulse (probe beam with a specific central wavelength) 301 which may be adjusted by a pulse picker. Then, the incident beam pulse 301 is propagating to a beam splitter (such as polarization beam splitter: PBS) 302 to create polarized orthogonal tick-tock pulses and output two beam pulses respectively. One beam pulse (tick pulse) of the two beam pulses directs to a mirror 303 for beam reflecting by the mirror 303 and another beam pulse (tock pulse) of the two beam pulses directs to a mirror 304 for beam reflecting by the mirror 304. The tick pulse has different reflecting distance relative to the polarization beam splitter 302 from that of the tock pulse such that wavefront of the two beam pulses has different optical path difference. This is, two different optical path difference (OPD) of the tick pulse 305 and the tock pulse 306 can be produced after passing through the polarization beam splitter 302. Therefore, for the detection of a sample 307, the elapsed time of tick-tock pulses can be adjusted by changing the optical path difference (OPD) in between the pulse pair arms. The tick pulse 305 and the tock pulse 306 are successively passing through the sample 307 to produce two object waves. The optical field of the two object waves passing through a lens 308 is further to be collected, penetrated, or reflected from the sample 307, or to be enlarged to form an amplifying beam.

As noted above, after the beam pulse 301 is generated by the pulse laser 300, the tick pulse 305 and the tock pulse 306 with adjustable elapsed time can be produced through the polarization beam splitter 302 and the mirrors 303, 304. The tick pulse 305 and the tock pulse 306 arrive on the sample 307 under measuring at different time points to stimulate or observe the dynamic changes of optical field of the wavefront of the sample 307, and to collect, penetrate, or reflect the optical field of the sample 307 through the lens 308. In another embodiment, the two object waves pass through the lens and then incident to the sample 307 at an incident angle.

Subsequently, after the two object waves are successively passing through another polarization beam splitter 309, each of the two object waves generates two orthogonal polarization beam pulses. After the detected object waves is diffracted and transmitted to the spatial light modulator 310, binary coding is performed. Meanwhile, binary information is inputted into the spatial light modulator 310, which means that the spatial light modulator 310 will acquire a non-imaging encoded sampling with binary code. The spatial light modulator 310 has complementary characteristics of amplitude modulation for orthogonal polarization beam, and therefore the wavefront of the two beam pulses may be performed a spatially encoding by binary spatial light modulator 310 to generate two complementary binary codes (Mtic, Mtoc), so as to achieve the purpose of spatial multiplexing. Then, the encoded optical field is passing through a lens 311 and a grating 312 to split the two beam pulses. The grating 312 may be used for diffracting with multiple orders. Then, the split optical field is propagating to a focal plane through a lens 313, and the two beam pulses on one path after optical field splitting is passing through a low pass filter 314 for filtering to obtain a reference beam 317 and the two beam pulses on another path after optical field splitting is as an object beam 316. Next, the object beam 316 and the reference beam 317 are collected through a lens 315 and then transmitted to an image sensor 320 to record interference of the object beam 316 and the reference beam 317, and thereby creating a composite digital hologram of the two beam pulses. That is, the image sensor 320 is used for recording to obtain digital hologram recording. In this embodiment, the two beam pulses are directly imaged on the image sensor 320 via a 4F imaging system. The lens 313 and the lens 315 can be generally referred to as a 4F imaging system. Filter 314, such as low pass filter, is placed on between the lens 313 and the lens 315, for example on focal plane or Fourier plane of the 4F imaging system. Thus, unnecessary reference beam 317 can be filtered out so as to obtain hologram readout signal and hologram overlapping of the object beam 316 and the reference beam 317.

In this embodiment, wavefront of the two beam pulses is simultaneously recorded in a digital hologram through a common-path digital holographic scheme. Through the known binary coding, the hologram information recorded by the wavefront of the two beam pulses can be obtained from the digital hologram. The simulation patterns of the digital tick sub-hologram 1 and the tock sub-digital hologram 2 are indicated by 401 and 402 respectively, as shown in FIG. 9a. FIG. 9a shows a digital hologram of the two beam pulses, which is decoded from the composite digital hologram by the complementary binary code. Then, by digital holographic wavefront reconstruction mechanism or approach combining with image processing approach (compressive sensing approach or nonlinear image recovery approach) to compensate missing information of the hologram due to binary encoding, high quality amplitude image information and phase image information are reconstructed, as shown in FIG. 9b and FIG. 9c.

The amplitude image shown in FIG. 9b indicates the resolution target reconstructed by the tick and tock sub-holograms (left and right, respectively) after recovering the missing data in holograms by using the compressive sensing algorithm, wherein the reconstructed amplitude image of the digital hologram 1 and the digital hologram 2 is indicated by 403 and 404, respectively. The results showed that Element 5 in Group 8 can be recovered after 100 iterations in the compressive sensing algorithm, indicating that the spatial resolution of the TTP-DHM is up to proximately 1 µm (micron) both in tick and tock sub-holograms reconstruction.

The phase image shown in FIG. 9c indicates the resolution target reconstructed by the tick and tock sub-holograms (left and right, respectively), wherein the reconstructed phase image of the digital hologram 1 and the digital hologram 2 is indicated by 405 and 406, respectively. As shown in FIG. 9c, a planar phase plane was detected to evaluate the phase accuracy in the TTP-DHM system by calculating the standard deviation of the reconstructed phase profile from tick and tock sub-holograms, indicating that the phase accuracy can be recovered from 8° to 1° after calculating 100 iterations in the compressive sensing algorithm.

The results shown in FIGS. 9a-9c indicate that the proposed spatial multiplexing efficiently detects the two wavefronts simultaneously without sacrificing the spatial resolution and phase accuracy during wavefront reconstruction.

Figure 10:
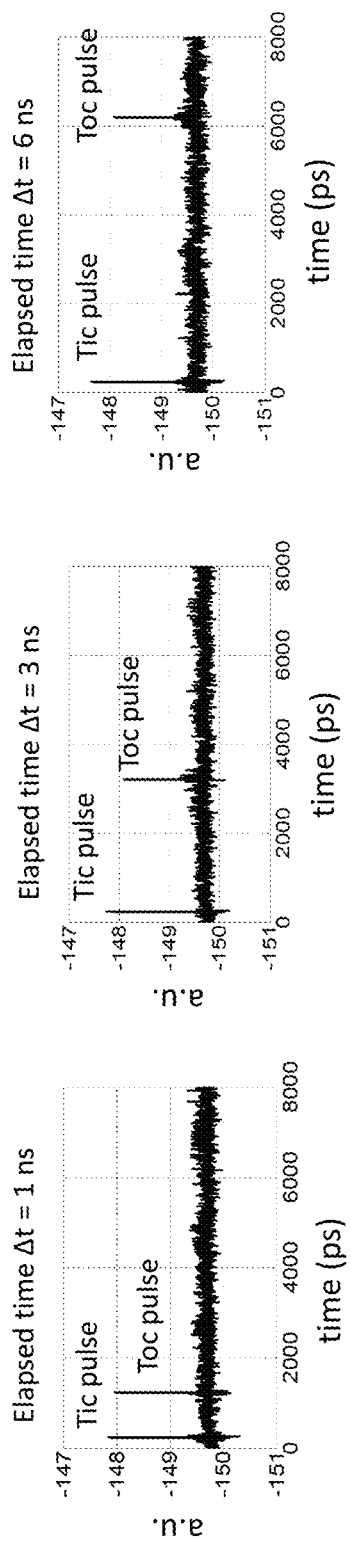
FIG. 10 illustrates the interval times between tick and tock pulses detected by a photodetector.
Figure 11:
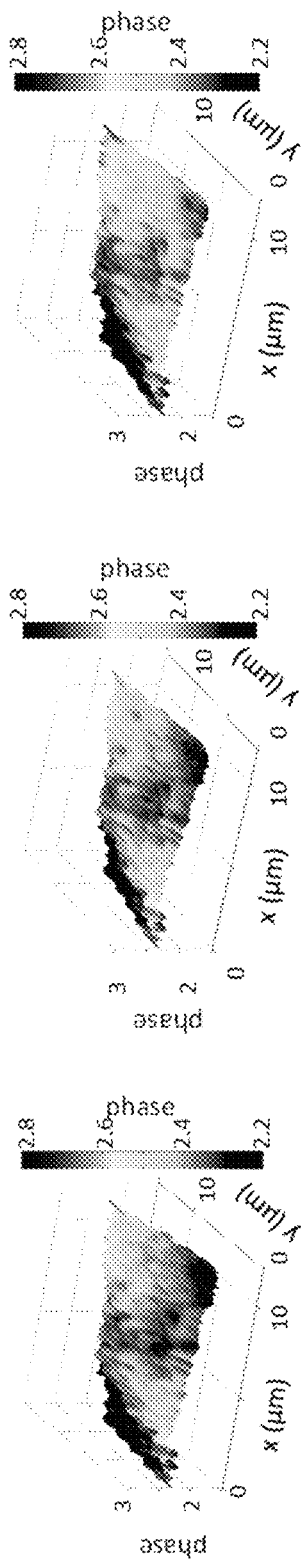
FIG. 11 illustrates the experimental results of the pulse-induced thermal effect of tick pulses in a PMMA sample.
Figure 12:
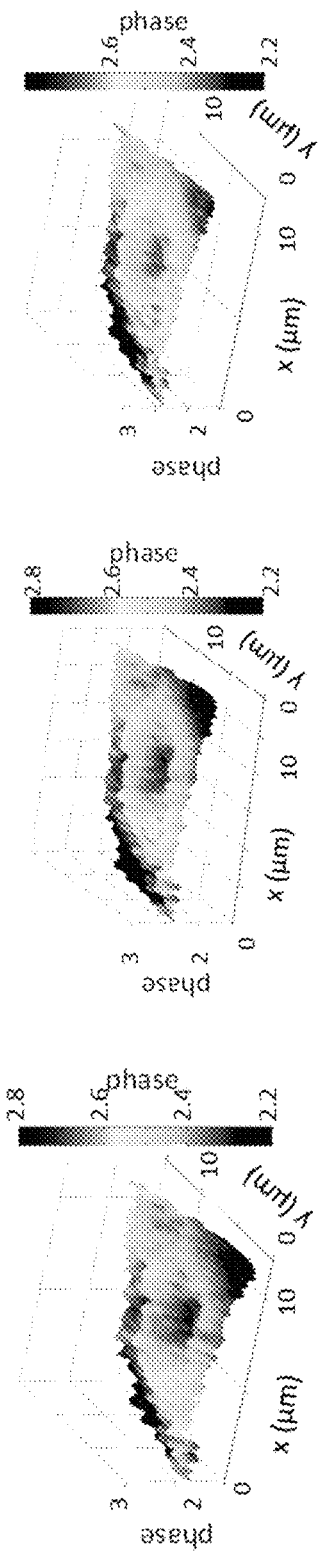
FIG. 12 illustrates the experimental results of the pulse-induced thermal effect of tock pulses in a PMMA sample.

As shown in FIGS. 11 and 12, the proposed scheme of time-resolved operation in the femtosecond, nanosecond elapsed time may be performed to detect the pulse-induced thermal effect of beam pulses in a poly (methyl methacrylate) (PMMA) sample, or detect phase change of the pulse-induced thermal effect in graphene sample in the femtosecond timescale. FIGS. 11 and 12 respectively show the experimental results of the pulse-induced thermal effect of tick and tock pulses in a PMMA sample in the nanosecond timescale. The interval times between tick and tock pulses may be set as 1, 3, and 6 nanosecond (ns) by tuning the optical path difference between tick and tock pulses at 15, 45, and 90 centimeter (cm), shown in FIG. 10. The interval times may be detected by a photodetector. A pumping pulse is then incident to the PMMA for inducing the thermal effect in the PMMA. The pulse-induced phase variation caused by the thermal effect in the PMMA may be observed using tick and tock pulses, in which the elapsed time between tick and tock pulses was conducted by the timescale characterization.

Figure 13:
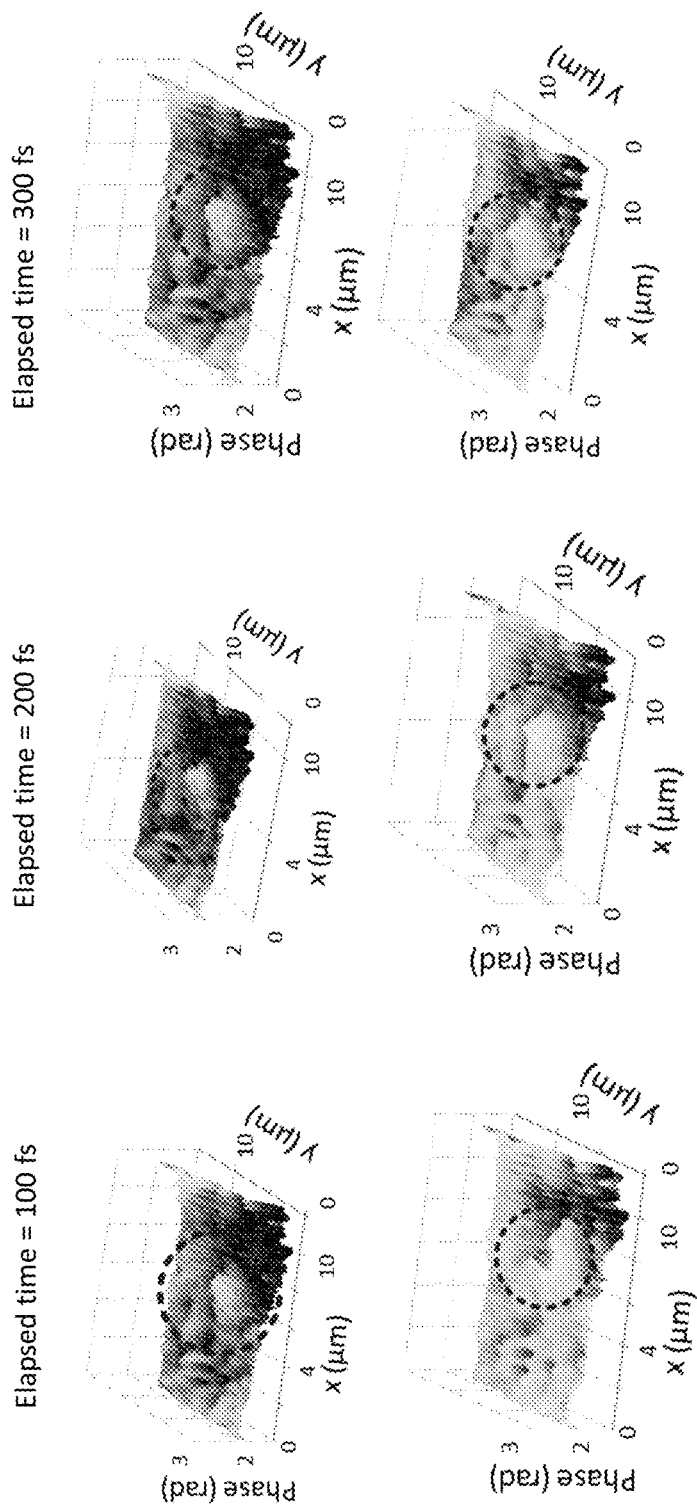
FIG. 13 illustrates the experimental results of the pulse-induced phase profiles in the graphene on the basis of elapsed time of 100, 200, and 300 fs and the phase changes at different elapsed time.
Figure 14:
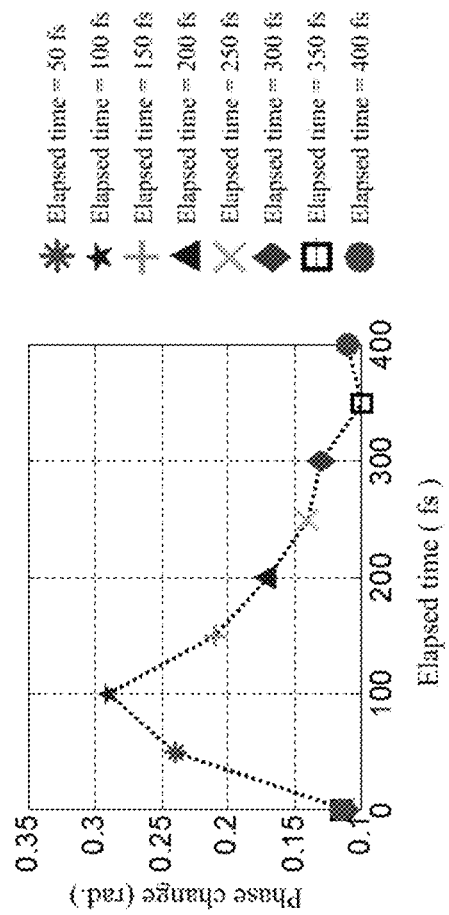
FIG. 14 illustrates 0~400 fs phase variation of the pulse-induced thermal effect in graphene.

FIG. 13 shows the experimental results of the pulse-induced phase profiles in the graphene on the basis of elapsed time of 100, 200, and 300 fs and the phase changes at different elapsed time. The sample is prepared through spin coating of graphene in aqueous solutions on the slide glass, on which the depth of the graphene was approximately 50 nanometer (nm). The phase variation of each tock pulse is shown at the bottom of FIG. 13, where the phase change at different elapsed time can be estimated approximately as 0.27, 0.16, and 0.11 rad. FIG. 14 shows 0~400 fs phase variation of the pulse-induced thermal effect in graphene. Thus, the pulse-induced phase changes at different elapsed time (0~400 fs) are plotted in FIG. 14, where the phase change was increased until up to 100 fs and then decreased in reverse after 150 fs. The results confirmed that the ultrashort phenomenon of the photoexcited carrier effect in graphene reacted in a sub-picosecond timescale, consistent with the proposed invention.

In some embodiments, the holograms may be utilized by mechanically moving photodetector array, the measured object and incident beam for expanding wide field to generate digital hologram of on-axis, off-axis, in-line or common-path optical scheme.

In one embodiment, the beam splitting element includes a beam splitter or a dichroic mirror. The dichroic mirror allows for a specified wavelength light reflected and other wavelengths light passing through.

In one embodiment, two light waves interference is forming at least one holographic image as wavefront recording of digital holographic image and the following wavefront reconstructing and tomographic reconstruction to obtain a digital holographic microtomography of the sample. the reference wave includes a planar wave, a spherical wave or an arbitrary surface wave. The digital holographic image of the sample includes amplitude image and phase image.

In summary, the invention proposed and demonstrated a novel time-resolved imaging technique to detect ultrafast events in a sample, based on tick-tock pulsed DHM with a stopwatch-like tunable timescale ranging from nanoseconds to femtoseconds. The temporal resolution of the proposed TTP-DHM is fundamentally limited only by the pulse duration of tick-tock pulses, and the tunable timescale dynamic measurement can be performed readily by adjusting the optical path length between the tick and tock arms. Hence, this invention provides potential applications for exploring dynamic phenomena and ultrafast optics considering quantitative phase imaging and wavefront reconstruction.

As will be understood by persons skilled in the art, the foregoing preferred embodiment of the present invention illustrates the present invention rather than limiting the present invention. Having described the invention in connection with a preferred embodiment, modifications will be suggested to those skilled in the art. Thus, the invention is not to be limited to this embodiment, but rather the invention is intended to cover various modifications and similar arrangements included within the spirit and scope of the appended claims, the scope of which should be accorded the broadest interpretation, thereby encompassing all such modifications and similar structures. While the preferred embodiment of the invention has been illustrated and described, it will be appreciated that various changes can be made without departing from the spirit and scope of the invention.

What is claimed is:

1. A method for time-resolved digital holography, comprising:

transmitting a first beam pulse through a sample at a first time point and a second beam pulse through said sample at a second time point, wherein an elapsed time is a period between said first time point and said second time point and said first beam pulse is created by said elapsed time previous to said second beam pulse;

separately spatially encoding for a first wavefront of said first beam pulse and a second wavefront of said second beam pulse by an optical encoder to create a first encoded spatial wavefront and a second encoded spatial wavefront;

recording a one-shot composite digital hologram of said first encoded spatial wavefront and said second encoded spatial wavefront by a digital holographic access unit in a single holographic exposing process;

decoding said composite digital hologram to obtain at least two different digital holograms by at least one decoder;

utilizing an image processing approach for processing said at least two different digital holograms to recover hologram data of said sample; and utilizing a wavefront reconstructing approach to reconstruct said hologram data to obtain a reconstructed wavefront of said sample.

2. The method of claim 1, wherein said optical encoder includes a spatial light modulator.

3. The method of claim 1, wherein said optical encoder includes a micro display.

4. The method of claim 1, wherein said digital holographic access unit includes a photodetector array.

5. The method of claim 1, wherein said digital holographic access unit includes an image sensor.

6. The method of claim 1, wherein said wavefront reconstructing approach includes Fourier transform approach.

7. The method of claim 1, wherein said wavefront reconstructing approach includes convolution approach.

8. The method of claim 1, wherein said wavefront reconstructing approach includes angular spectrum approach.

9. The method of claim 1, wherein said wavefront reconstructing approach includes Fresnel diffraction approximation approach.

10. The method of claim 1, wherein said image processing approach includes a compressive sensing approach.

11. The method of claim 1, wherein said image processing approach includes a non-linear image recovery approach.

12. An apparatus for time-resolved digital holography, comprising:

a pulsed laser for creating two beam pulses with a first beam pulse and a second beam pulse which arrive on a sample at different time points;

an optical encoder for separately spatially encoding a first wavefront of said first beam pulse and a second wavefront of said second beam pulse;

a digital holographic access unit for recording a one-shot composite digital hologram of said first encoded spatial wavefront and said second encoded spatial wavefront; and a wavefront reconstruction unit to reconstruct said first encoded spatial wavefront and said second encoded spatial wavefront.

13. The apparatus of claim 12, wherein said optical encoder includes a spatial light modulator.

14. The apparatus of claim 12, wherein said optical encoder includes a micro display.

15. The apparatus of claim 12, wherein said digital holographic access unit includes a photodetector array.

16. The apparatus of claim 12, wherein said digital holographic access unit includes an image sensor.

17. The apparatus of claim 12, wherein said wavefront reconstruction unit includes at least one computer, used for decoding, separating wavefront of said at least two beam pulses.

18. The apparatus of claim 12, further comprising a beam splitting element configured in front of said pulsed laser.

19. The apparatus of claim 12, wherein said pulsed laser includes a Ti-sapphire laser.

20. The apparatus of claim 12, further comprising at least one fiber grating to split said at least two beam pulses.

* * * * *